United States Patent [19]

Dykstra

[11] Patent Number: 4,501,256
[45] Date of Patent: Feb. 26, 1985

[54] SOLID STATE MAGNETO IGNITION SWITCHING DEVICE

[76] Inventor: Richard A. Dykstra, 169 Ramaker Ave., Cedar Grove, Wis. 53013

[21] Appl. No.: 583,447

[22] Filed: Feb. 24, 1984

[51] Int. Cl.³ .......................... F02P 3/04; F02P 9/00; F02P 1/00; F02P 11/00
[52] U.S. Cl. .................................. 123/651; 123/656
[58] Field of Search ................ 123/651, 656, 599; 307/30 J, 252 C, 269 SC; 315/209 T

[56] References Cited

U.S. PATENT DOCUMENTS

| | | | |
|---|---|---|---|
| 3,878,452 | 4/1975 | Haubner et al. | 123/651 |
| 3,938,491 | 2/1976 | Mazza | 123/651 |
| 3,958,546 | 5/1976 | Ohki et al. | 123/651 |
| 3,963,015 | 6/1976 | Haubner et al. | 123/651 |
| 4,016,433 | 4/1977 | Brooks | 123/651 |
| 4,122,814 | 10/1978 | Ford | 123/651 |
| 4,130,101 | 12/1978 | Jundt et al. | 123/651 |
| 4,163,437 | 8/1979 | Notoras et al. | 123/651 |
| 4,176,644 | 12/1979 | Hellberg et al. | 123/651 |
| 4,194,482 | 3/1980 | Jackson | 123/651 |
| 4,233,951 | 11/1980 | Take | 123/651 |
| 4,270,509 | 6/1981 | Tharman | 123/607 |
| 4,270,510 | 6/1981 | Nanjo et al. | 123/651 |
| 4,282,839 | 8/1981 | Newberry et al. | 123/651 |
| 4,342,304 | 8/1982 | Watanabe | 123/599 |

Primary Examiner—Raymond A. Nelli
Attorney, Agent, or Firm—Wheeler Law Firm

[57] ABSTRACT

A magnet rotating synchronously with an internal combustion engine magnetically couples periodically with a stator having primary and secondary windings to induce a voltage in the primary winding. A switching transistor is connected across the primary winding terminals. A voltage divider circuit is connected between one primary winding terminal and the transistor base for supplying base-emitter current when the primary voltage reaches a predetermined level, thereby turning the transistor switch on. The anode and gate of a programmable unijunction transistor (PUT) are connected to points in the divider to sense increasing base current and a corresponding increasing PUT anode-to-gate voltage. At a specific anode-gate voltage, the PUT conducts to short circuit the transistor switch base current, and turn the switch off. This causes the magnetic field in the stator to collapse and induce a high voltage in the secondary winding to fire the engine spark plug.

19 Claims, 6 Drawing Figures

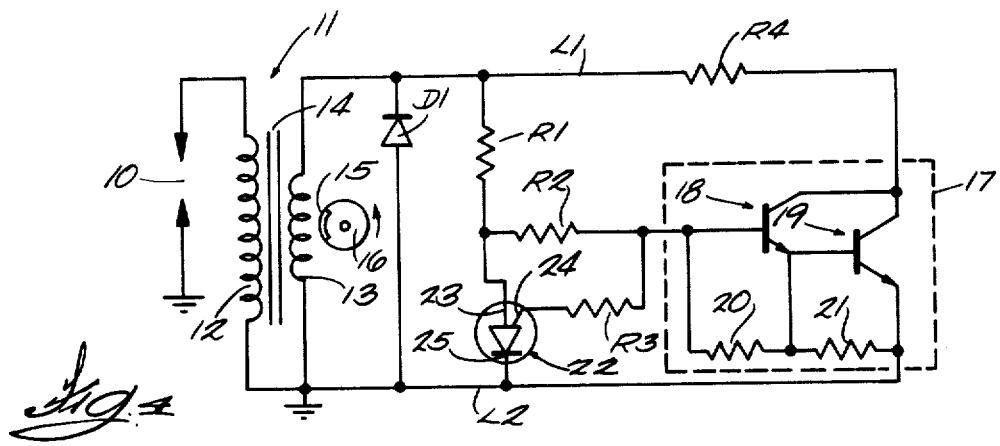
_Fig.4_
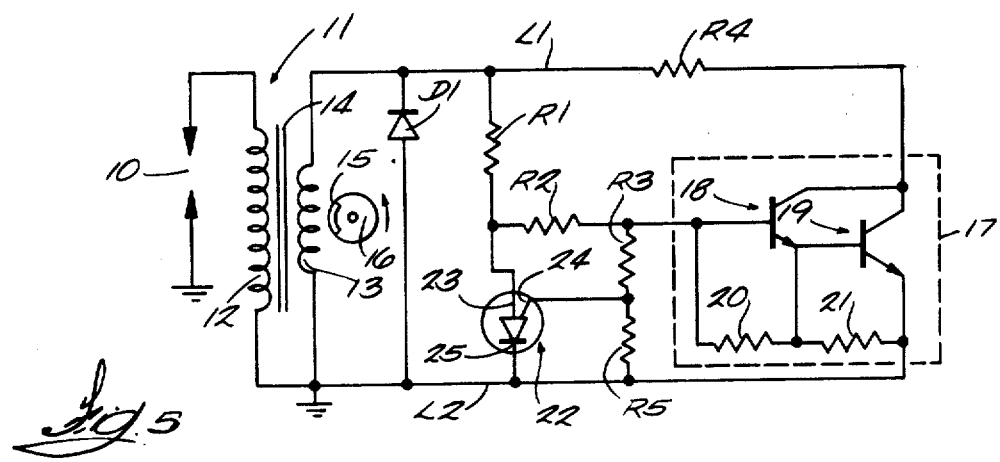
_Fig.5_
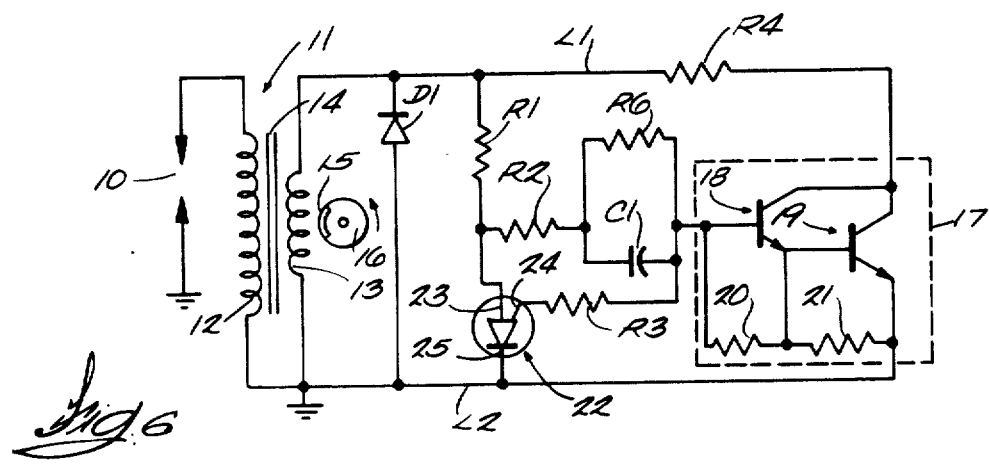
_Fig.6_

SOLID STATE MAGNETO IGNITION SWITCHING DEVICE

BACKGROUND OF THE INVENTION

This invention relates to a magneto ignition system for internal combustion engines which use semiconductor or solid-state devices to perform switching functions somewhat analogous to the functions performed by prior art breaker points.

There are prior art solid-state magneto ignition control systems wherein a permanent magnet traverses a magnetic core or stator synchronously with engine rotation. A low voltage primary winding and a high voltage secondary winding on the stator constitute a step-up transformer or ignition coil and the secondary winding is connected to the spray plug. There is a semiconductor power switching device, such as a transistor or Darlington transistor pair connected in series with the primary coil. As the field of the rotating magnet becomes coupled with the stator an increasing essentially sinusoidal voltage is developed in the primary winding and at some small positive voltage level the power switching device turns on and current through the primary winding rapidly increases to a value that is limited only by the total impedance of the primary winding and switching circuitry. A control transistor is typically used in the prior designs in conjunction with the power switching device. The control transistor responds to sensing that the voltage across the primary winding has reached a specific level by becoming conductive to thereby cut off the driving current for the semiconductor power switching device and the latter switches to a nonconductive state abruptly. The abrupt interruption of current flow through the primary winding causes the magnetic field to collapse so as to induce a high voltage in the secondary winding to thereby produce a spark plug discharge.

When a transistor is used for the voltage sensing or control device, the power switching device will remain off only as long as the primary winding voltage remains higher than the predetermined voltage at which switching first occurred. When the primary winding voltage falls below that level, the power switching device will turn on again and a new operating cycle will begin if enough energy is still available in the rotating magnet and magneto stator. This can result, undesirably, in an ignition voltage waveform having a series of short duration pulses when the control transistor technique is applied to some magneto ignition coils.

In many instances, engine designers prefer a single ignition pulse of relatively long duration rather than a series of short duration pulses as commonly occur in ignition switching circuits that use an ordinary transistor for voltage sensing or control of the power switching device. Known systems that use an SCR for switching control have a capability of providing a longer duration ignition spark, since once an SCR has switched on it will remain on, and the power switching device will remain off, as long as current is sustained through the SCR. The SCR desirably will remain on and the power switching device off until generated ignition coil primary winding voltage reaches a much lower level than for ignition control circuits where a transistor is used for controlling the power switching device.

SUMMARY OF THE INVENTION

An objective of the present invention is to provide a magneto ignition control circuit that affords adjustability or programming of the ignition coil primary winding voltage at which the power switching semiconductor device will turn on and turn off.

Another objective is to minimize the number of electrical components required in a solid-state magneto control system.

Another objective is to provide a magneto ignition switching circuit that produces a long duration spark across the spark plug electrodes; that includes multiple modes of selecting or programming primary winding current switching levels; that avoids the need for any auxiliary driving coil; and, that can be applied to engines by original equipment manufacturers or be installed as a replacement for ignition controls that use breaker points and condensers or one of the prior art solid-state ignition control circuits.

Briefly stated, in accordance with the invention, a programmable unijunction transistor (PUT) is used for sensing the ignition coil primary winding voltage and for turning a power switching semiconductor device on and off. The PUT provides switching characteristics that are advantageous over use of a transistor for sensing voltage level. The PUT, once it is switched on, will remain on as long as current is sustained through it. This makes it possible to provide an ignition voltage waveform of comparatively long spark duration. The PUT has advantages over conventional SCR control devices. When an SCR switch is on, the base-emitter voltage of the power switching device is limited to the anode-cathode voltage of the SCR. In the new circuit using a PUT, when switching occurs, the base-emitter voltage of the power switching device is limited to the gate-cathode voltage of the PUT, or to a combination of gate-cathode voltage and a portion of the anode-gate voltage. This voltage limit is typically lower than the limit provided by the anode-cathode of a conventional SCR. There are typically only two p-n junction voltage drops as compared to prior art circuits using conventional SCR's wherein there is an additional p-n junction voltage drop. As a result, improved switching characteristics are obtained.

The manner in which the foregoing and other significant features of the invention are obtained will become evident in the ensuing description of some embodiments of the present invention which will now be described with reference to the drawings.

DESCRIPTION OF THE DRAWINGS

FIGS. 1-6 are circuit diagrams of successively increasingly developed embodiments of the new magneto ignition control circuit.

DESCRIPTION OF A PREFERRED EMBODIMENT

Figure 1:
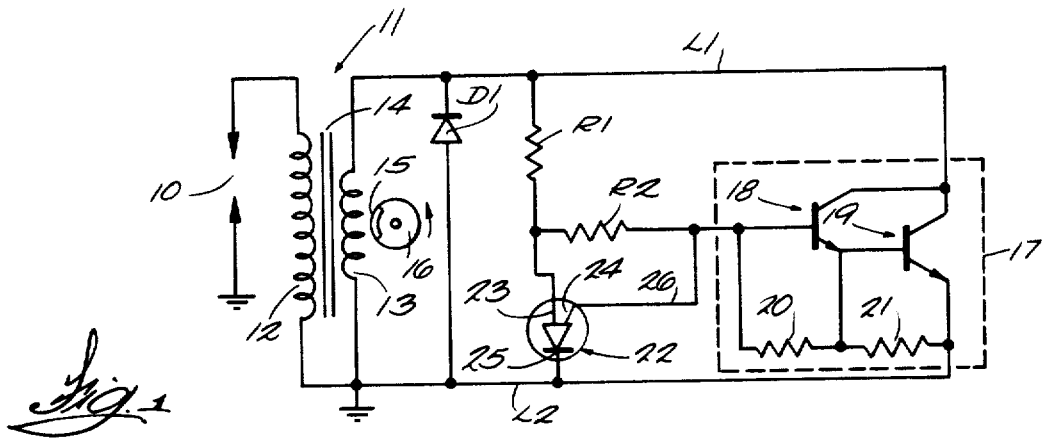

FIG. 1 is the first embodiment of the new magneto ignition control circuit. In this figure an engine spark plug is symbolized by the spaced apart electrodes 10. The ignition coil is designated generally by the numeral 11. The ignition coil comprises a secondary or high voltage winding 12 and a primary winding 13. The primary and secondary windings are on a magnetic core or stator 14. Voltage is induced in the primary winding by a rotating or orbiting magnet 15. The magnet may be on the periphery of a rotatable member 16 which is typically the flywheel of an internal combustion engine. In the actual engine, the stator 14 may have the traditional horseshoe shape providing a gap whose reluctance is minimized when it is aligned with the orbiting magnet. In any case, the magnet passes the stator synchronously with engine rotation.

The ignition control circuit in FIG. 1 comprises two lines L1 and L2 which connect to and correspond to the first and second terminals of the ignition coil primary winding 13. The circuit includes a diode D1, resistors R1 and R2, and a Darlington transistor pair constituting a power switching device within the confines of the dashed line rectangle 17. The Darlington pair includes transistors 18 and 19 and stabilizing resistors 20 and 21.

The Darlington transistor means is illustrative of a solid-state switching device having a control terminal to which control voltage signal above a predetermined level is applied and removed to switch said device between its conductive and nonconductive states, respectively. In the various embodiments of the ignition control circuit described herein, the base of transistor 18 constitutes the control signal input terminal for switching device 17. By way of example, a single transistor having suitable rating could be used as the switching device.

The circuit includes a programmable unijunction transistor (PUT) designated generally by the numeral 22. PUT 22 has an anode terminal 23, a gate terminal 24 and a cathode terminal 25, hereinafter referred to as the anode, gate and cathode, respectively. The PUT, as is known, is basically a thyrsitor or pnpn device. Resistors R1 and R2 constitute a voltage divider. When the anode-gate junction conducts, regeneration occurs and the anode-to-cathode resistance decreases to a very low value. The peak and valley currents of a PUT are quite low. It has low reverse leakage current and extremely low switching and operating currents. It also has a low operating voltage capability. The PUT becomes conductive at a very precise peak or triggering voltage. Its triggering level can be programmed by varying values of external resistors in a divider circuit or in response to the voltage applied to its anode.

In FIG. 1, as the rotating magnet 15 magnetically couples with the stator 11, the upper terminal of the primary winding is negative as is line L1 and PUT 22 and the Darlington transistor pair are nonconductive. As the moving magnet progresses, the voltage developed across primary winding 13 and, hence, line L1 goes positive, and when it reaches a specific level, conduction begins from the first terminal L1 of the primary winding through R1, R2 and the base-emitter of the Darlington pair. With base current flowing, a potential develops across divider resistors R1 and R2. The power switching device, that is, the Darlington transistor pair, then switches to a conductive state and current flows through transistors 18 and 19 from L1 to L2, the second terminal of the primary winding, and through the primary winding 13 of ignition coil 11. The gate 24 of the PUT is coupled to the base of the Darlington transistor pair by means of a conductor 26 in the FIG. 1 embodiment. The PUT gate voltage is, thus, the same as the Darlington transistor's base-emitter voltage drop. As the engine driven magneto magnet 15 continues to rotate past the stator while the Darlington transistor pair or power switching device is conducting, the Darlington base current, collector current and collector-emitter voltage continue to increase. As the Darlington transistor pair base current supplied through resistors R1 and R2 increases, so does the voltage drop across resistors R1 and R2.

When the voltage across R2 exceeds the anode-gate turn-on voltage level of the PUT, the PUT switches on or becomes conductive and the Darlington pair's base-emitter voltage drops well below the value required to sustain conduction in the Darlington pair. Consequently, both transistors 18 and 19 in the Darlington pair switch off or become nonconductive in which case the primary winding 13 current is suddenly interrupted. the magnetic field collapses and a high voltage is developed in the secondary winding 12 of the ignition coil which causes a spark discharge across the spark plug 10 electrodes to ignite the fuel in the internal combustion engine. The PUT remains conductive and the Darlington transistors remain turn off until the primary winding 13 voltage drops to a very low value. This results in an ignition waveform with a relatively long spark duration. Of course, when the voltage in the primary winding 13 reverses, the conduction path is through diode D1. Diode D1 can be eliminated if the Darlington transistor pair has a reverse diode as an integral part of its package.

The switching current level of the circuitry in FIG. 1 is determined by selection of the values of resistors R1 and R2. The PUT can be programmed to trigger at various primary winding currents by altering R1, R2 or both.

Figure 2:
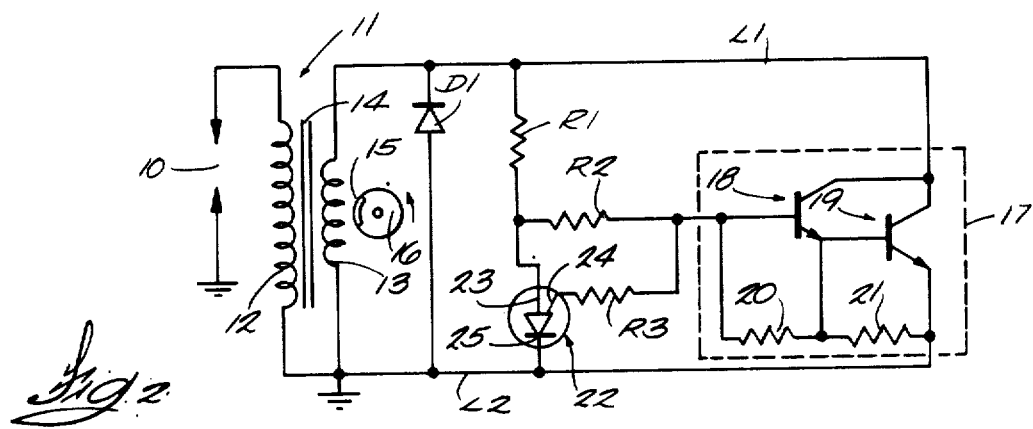

The circuit in FIG. 2 is functionally similar to the circuit in FIG. 1 except that another resistor, R3, has been added. Similar components in both embodiments are given the same reference numerals. Resistor R3 increases the effective gate resistance, $R_G$, of the PUT, thus increasing its switching sensitivity. By increasing $R_G$, the peak or triggering current of the PUT can be reduced so it triggers at a lower peak point current.

Figure 3:
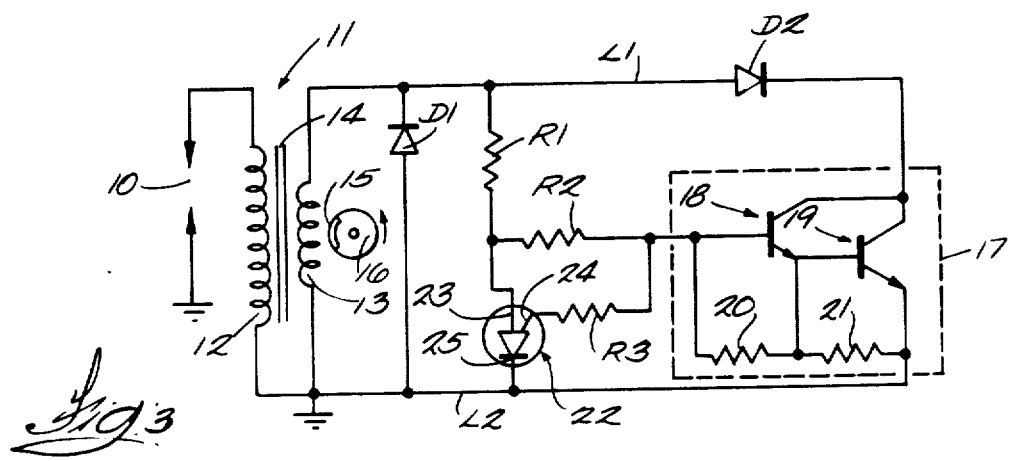

An alternative and more advanced embodiment of the programmable control circuit is shown in FIG. 3 where components that are used in FIGS. 1 and 2 embodiments are given the same reference numerals. The FIG. 3 embodiment is similar to the FIG. 2 embodiment except that a diode, D2, has been inserted in series with the Darlington transistor's 17 collector line. D2 couples the collector of the transistor means to primary winding first terminal L1. D2 is preferably a silicon diode so it has about a 0.6 volt drop across it when conducting. Thus, diode D2 serves to increase the voltage across the entire circuit, that is, between lines L1 and L2 for a given value of Darlington collector current to thereby increase the rate of rise of the circuit voltage as a function of collector current, thereby demonstrating another way of altering the characteristics or programming the PUT control circuit. If the ratio of values of R1 and R2 is held fixed, the number of diodes in the Darlington pair's collector lead can be used to incrementally determine or program the circuit's switching current level.

Some Darlington transistor pairs can be obtained with a diode corresponding to diode D1 incorporated in the Darlington package. In such case, particularly in FIGS. 1 and 2, diode D1 would be unnecessary. However, even if there were a reverse voltage diode connected between the collector and emitter of the Darlington pair in the FIG. 3 embodiment, diode D1 would still be necessary if an opposite half-cycle current path and/or reverse voltage protection are desired for the circuit, since diode D2 will render the reverse diode in a Darlington package useless for those purposes.

FIG. 4 is another alternative embodiment of the PUT controlled magneto ignition circuit. This embodiment is comparable to the FIG. 3 embodiment except that diode D2 has been replaced by a very low value resistor R4 in FIG. 4. Resistor R4 has basically the same purpose as diode D2 in the FIG. 3 embodiment. That is, current through resistor R4 results in a voltage being developed across it. This increases total circuit voltage between L1 and L2 for a given value of Darlington pair collector current and increases the rate of rise of circuit voltage as collector current increases. With a fixed ratio of resistance values for resistors R1 and R2, the value of resistor R4 can be used to determine the point at which primary winding current is interrupted, thus offering another way of programming or setting the PUT trigger point which brings about switching the power switching device or Darlington pair 17 off whereupon the point at which the primary winding current is interrupted is determined. In the FIG. 4 embodiment, diode D1 could again be eliminated if the Darlington transistor pair 17 has a reverse voltage diode, not shown, connected between the collector and emitter of the Darlington pair and in the same package and poled similarly to diode D1.

The FIG. 5 embodiment illustrates another way in which the PUT 22 can be programmed to switch and become conductive in response to a selectable PUT anode-gate signal. In this circuit R5 has been added as compared with the FIG. 4 circuit and R3 and R5 constitute a voltage divider in the FIG. 5 embodiment. Now the voltage at the gate of the PUT 22 can be set at something less than the Darlington transistor pair 17 base-emitter voltage. This provides an offset or preset to the voltage across the anode-gate circuit of the PUT which can be used to program the switching point of the PUT. In other words, when the series circuit comprised of R1, R2, R3 and R5 begins to conduct, voltage will develop across R3 and R5. Thus, there will be a small offset voltage, less than the forward biasing voltage of the transistor pair, developed across R3 and this small voltage constitutes positive voltage offset across the anode-gate circuit of the PUT. One may see that the PUT can also be programmed insofar as its switching current level is concerned, by selection of the value of R5 in conjunction with R2 and R3.

In the FIG. 5 embodiment, diode D1 could also be eliminated if there were a corresponding diode in the Darlington pair package connected between the emitter and collector of transistor 19.

FIG. 6 is another embodiment of the magneto ignition control circuit. This circuit is especially adapted for lowering the engine speed at which ignition will first occur. It makes engine starting easier since ignition will occur at lower cranking speeds. It also increases ignition or spark energy as engine speed increases.

The FIG. 6 circuitry is similar to previously discussed embodiments except that some capacitance is added to the circuitry. As shown, the parallel combination of a resistor R6 and a capacitor C1 is connected in series with resistor R2. The capacitive reactance of capacitor C1 is relatively high at low engine speeds, but decreases as engine speed and the corresponding frequency of the primary 13 voltage increases. As a result, the impedance Z1, which is the series/parallel combination of R2, R6 and C1, decreases as engine speed increases and the proportion of impedance Z1 to the combined impedance R1+Z1 also decreases with increasing engine speed. This results in a change in the point at which PUT 22 conducts and a change in the value at which primary winding 13 current is interrupted throughout the operating speed range of the engine, said current interruption occurring at a lower value at low engine speeds and at progressively higher values as engine speed increases. Since the generated ignition voltage is a function of the value of primary current interrupted, available primary and secondary voltages will increase as engine speed increases.

It should be noted that the various features and characteristics discussed relative to FIGS. 1-6 in respect to incorporation of R3, D2, R4, R6 and C1, or the divider R3 and R5, need not be considered independently, but can be incorporated in combination as well.

Although various arrangements for controlling a programmable unijunction transistor that controls a power switching device in a solid state magneto ignition control circuit have been described in detail, such description is intended to be illustrative, rather than limiting. The invention should be limited in scope only by interpretation of the claims which follow.

I claim:

1. An ignition control circuit for an internal combustion engine having a magnet for magnetically coupling with a stator in synchronism with engine rotation to induce current flow between first and second terminals of a primary winding on the stator followed by interruption of the current to thereby induce a high voltage in a secondary winding that is connected to a spark plug; said control circuit comprising:

a solid state switching device having its switching path connected in a circuit between said first and second terminals of the primary winding and having a control terminal to which a control voltage above a predetermined level is applied to switch said device to a conductive state, a programmable unijunction transistor (PUT) having an anode, a cathode and a gate, voltage determining means connected between said first primary winding terminal and said control terminal for developing a voltage and means for applying said voltage between the anode and gate of said PUT, coupling of said magnet and stator causing voltage to be developed in said primary winding to thereby attain said predetermined voltage for switching said switching device to its conductive state whereby to increase current flow in said primary winding, and the concurrent increase in said PUT anode-to-gate voltage causing said PUT to conduct and remove said voltage from said control terminal to thereby switch said switching device to a nonconductive state whereby current flow through said primary winding is interrupted, and diode means connected between said second and first primary winding terminals for conducting the reverse current in said winding.

2. The control circuit according to claim 1 wherein said switching device comprises transistor means having a base constituting said control terminal, an emitter coupled to said second primary winding terminal and having a collector coupled to said first primary winding terminal.

3. The control circuit according to claim 1 wherein said voltage determining means is comprised of serially connected resistors, the anode of said PUT being connected to a point intermediate of said resistors, the gate of said PUT being connected to said control terminal and the cathode of said PUT being connected to said primary winding second terminal.

4. The control circuit according to any of claims 1, 2 or 3 including resistor means in a circuit connecting said switching device control terminal and said gate of the PUT.

5. The control circuit according to claim 2 including diode means through which said collector is coupled to said first primary winding terminal, said diode means being arranged to conduct in the same direction as said transistor means switching device when said device is in its conductive state.

6. The control circuit according to claim 2 including resistor means through which said collector is coupled to said first primary winding terminal.

7. The control circuit according to claim 2 including resistor means in a circuit connecting said control terminal and said gate of the PUT,
diode means through which said collector is coupled to said first primary winding terminal, said diode means being arranged to conduct in the same direction as said transistor means switching device when said device is in its conductive state.

8. The control circuit according to claim 2 including:
resistor means in a circuit connecting said control terminal and said gate of the PUT, and
resistor means through which said collector is coupled to said first primary winding terminal.

9. An ignition control circuit for an internal combustion engine having a magnet for magnetically coupling with a stator in synchronism with engine rotation to induce current flow between first and second terminals of a primary winding on the stator followed by interruption of the current to thereby induce a high voltage in a secondary winding that is connected to a spark plug; said control circuit comprising:
a solid state switching device having its switching path connected in a circuit between said first and second terminals of the primary winding and having a control terminal to which a control voltage above a predetermined level is applied to switch said device to a conductive state,
a programmable unijunction transistor (PUT) having an anode, a cathode and a gate,
a first voltage determining circuit connected between said first primary winding terminal and said control terminal, and an intermediate point in said first divider circuit coupled to said anode of the PUT,
a second voltage determining circuit connected between said control terminal and said second primary winding terminal, and an intermediate point in said second divider circuit coupled to said gate of the PUT.
coupling of said magnet and stator causing voltage to be developed in said primary winding and current to flow in said first voltage determining circuit to thereby attain said predetermined voltage for switching said switching device to its conductive state whereby to increase the current flowing in said primary winding, and the resulting proportional increase in current flowing through said first and second voltage determining circuits causing an increasing voltage at said anode of the PUT relative to said gate of the PUT causing said PUT to conduct and remove the voltage from said control terminal to thereby switch said switching device to a nonconductive state whereby current flow through said primary winding is interrupted, and
diode means connected between said second and first primary winding terminals for conducting the reverse current in said primary winding.

10. The ignition control circuit according to claim 9 wherein said switching device comprises transistor means having a base constituting said control terminal, an emitter coupled to said second primary winding terminal and having a collector coupled to said first primary winding terminal.

11. The ignition control circuit according to claim 9 wherein said first and second voltage determining circuits are comprised of series connected resistors.

12. The control circuit according to claim 10 including diode means through which said collector is coupled to said first primary winding terminal, said diode means being arranged to conduct in the same direction as said transistor means switching device when said device is in its conductive state.

13. The control circuit according to claim 10 incuding resistor means through which said collector is coupled to said first primary winding terminal.

14. An ignition control circuit for an internal combustion engine having a magnet for magnetically coupling with a stator in synchronism with engine rotation to induce current flow between first and second terminals of a primary winding on the stator followed by interruption of the current to thereby induce a high voltage in a secondary winding that is connected to a spark plug; said control circuit comprising:
a solid state switching device having its switching path connected in a circuit between said first and second terminals of the primary winding and having a control terminal to which a control voltage above a predetermined level is applied to switch said device to a conductive state,
a programmable unijunction transistor (PUT) having an anode, a cathode and a gate,
a voltage divider circuit including first resistor means connected on one side to said first primary winding terminal, second resistor means connected on one side to the other side of said first resistor means, a third resistor means and capacitor means connected in a parallel circuit one side of which is connected to the other side of said second resistor means and the other side of which is connected to said control termnal, the anode of said PUT connected intermediately of said first and second resistor means.
means for coupling said control terminal to said gate of the PUT,
coupling of said magnet and stator causing said voltage to be developed in said primary winding to thereby attain said predetermined voltage for switching said switching device to its conductive state whereby to increase current flow in said primary winding, and the concurrent increase in the anode-to-gate voltage across series connected second resistor means and parallel resistor and capacitor circuit causing said PUT to conduct and remove said voltage from said control terminal to thereby switch said switching device to a nonconductive state whereby current flow through said primary winding is interrupted, and
diode means connected between said second and first primary winding terminals for conducting the reverse current in said winding.

15. The control circuit according to claim 14 wherein said means for coupling said control terminal to the gate of said PUT is a resistor means.

16. The control circuit according to any of claims 14 or 15 wherein said switching device comprises transistor means having a base constituting said control terminal, an emitter coupled to said second primary winding terminal and having a collector coupled to said first primary winding terminal.

17. The control circuit according to claim 16 including diode means through which said collector is coupled to said first primary winding terminal, said diode means being arranged to conduct in the same direction as said transistor means switching device when said device is in its conductive state.

18. The control circuit according to claim 16 including resistor means through which said collector is coupled to said first primary winding terminal.

19. The control circuit according to claim 14 wherein said switching device comprises transistor means having a base constituting said control terminal, an emitter coupled to said second primary winding terminal and having a collector coupled to said first primary winding terminal, and said means for coupling said control terminal to the gate of said PUT is a resistor means.

* * * * *